(12) United States Patent
Inaba et al.

(10) Patent No.: US 9,258,903 B2
(45) Date of Patent: Feb. 9, 2016

(54) WIRING CIRCUIT BOARD AND MANUFACTURING METHOD THEREOF

(75) Inventors: Masaichi Inaba, Ushiku (JP); Masayuki Iwase, Tsukubamirai (JP)

(73) Assignee: NIPPON MEXTRON, LTD., Tokyo-To (JP)

( * ) Notice: Subject to any disclaimer, the term of this patent is extended or adjusted under 35 U.S.C. 154(b) by 605 days.

(21) Appl. No.: 13/381,198

(22) PCT Filed: Sep. 29, 2010

(86) PCT No.: PCT/JP2010/066953
§ 371 (c)(1),
(2), (4) Date: Dec. 28, 2011

(87) PCT Pub. No.: WO2011/096110
PCT Pub. Date: Aug. 11, 2011

(65) Prior Publication Data
US 2012/0103678 A1    May 3, 2012

(30) Foreign Application Priority Data

Feb. 3, 2010    (JP) .................................. 2010-022430

(51) Int. Cl.
*H05K 1/11*    (2006.01)
*H05K 3/24*    (2006.01)
*H05K 3/34*    (2006.01)

(52) U.S. Cl.
CPC ........ *H05K 3/244* (2013.01); *H01L 2224/8384* (2013.01); *H01L 2924/01079* (2013.01); *H05K 3/3452* (2013.01); *H05K 2201/099* (2013.01); *Y10T 29/49155* (2015.01)

(58) Field of Classification Search
CPC ....... H05K 1/092; H05K 1/095; H05K 1/097; H05K 3/246; H05K 3/244; H05K 1/111; H05K 2201/0317; H05K 2201/0335
USPC ......... 361/748, 757, 760, 762, 765, 767, 768, 361/771, 777, 779, 808; 174/257
See application file for complete search history.

(56) References Cited

U.S. PATENT DOCUMENTS

| | | | | |
|---|---|---|---|---|
| 5,383,093 A * | 1/1995 | Nagasaka | ...................... | 361/771 |
| 8,319,096 B2 * | 11/2012 | Ishikawa et al. | ............... | 136/256 |
| 8,400,777 B2 * | 3/2013 | Ide et al. | ........................ | 361/767 |
| 8,570,763 B2 * | 10/2013 | Sekimoto | ....................... | 361/779 |
| 2009/0194151 A1 * | 8/2009 | Ishikawa et al. | ............... | 136/252 |
| 2010/0051329 A1 * | 3/2010 | Kim et al. | ...................... | 174/255 |
| 2010/0059251 A1 * | 3/2010 | Remizov et al. | ............... | 174/250 |

FOREIGN PATENT DOCUMENTS

| | | |
|---|---|---|
| JP | 61-58289 A | 3/1986 |
| JP | 06-120643 | 4/1994 |
| JP | 06-158289 | 6/1994 |
| JP | 2002-255645 | 9/2002 |

(Continued)

*Primary Examiner* — Hoa C Nguyen
*Assistant Examiner* — Christopher L Augustin
(74) *Attorney, Agent, or Firm* — Jacobson Holman, PLLC.

(57) ABSTRACT

It is an object to form a conductive intermediate layer having a function of maximally preventing a solder leaching phenomenon with a low environment load and with good productivity.

There are provided an insulative base material 2, a wiring circuit pattern 3 formed on at least one surface of the insulative base material 2, an electronic part mounting land 31 which is formed as part of the wiring circuit pattern 3 and on which an electronic part 7 is to be mounted, and a conductive intermediate layer 5 made of a sintered conductive ink film on the electronic part mounting land 31.

7 Claims, 10 Drawing Sheets

(56) References Cited

FOREIGN PATENT DOCUMENTS

| JP | 2005-081335 | 3/2005 |
| JP | 2005-217249 | 8/2005 |
| JP | 2007-066998 | 3/2007 |
| JP | 2009-272424 | 11/2009 |

* cited by examiner

US 9,258,903 B2

WIRING CIRCUIT BOARD AND MANUFACTURING METHOD THEREOF

This is a national stage of PCT/JP2010/066953 filed Sep. 29, 2010 and published in Japanese, which has a priority of Japanese no. 2010-022430 filed Feb. 3, 2010, hereby incorporated by reference.

TECHNICAL FIELD

The present invention relates to a wiring circuit board and manufacturing method thereof, and more specifically to a wiring circuit board having a conductive intermediate layer on a land on which various electronic parts are mounted, and manufacturing method thereof.

BACKGROUND ART

When electronic parts are mounted on a wiring circuit board on which a wiring circuit pattern is formed, generally an electronic part mounting land provided as part of the wiring circuit pattern is electrically connected to terminal electrodes of the electronic parts via a solder material.

For the purpose of preventing a phenomenon called "solder leaching", a conductive intermediate layer is formed on a surface of the electronic part mounting land of the wiring circuit board by an electrolytic plating method or electroless plating method. The "solder leaching" is a phenomenon that a wiring circuit pattern formed on a wiring circuit board leaches into a solder material. In order to prevent the "solder leaching", a method for forming a conductive intermediate layer as a barrier layer is often employed for solder-bonding electronic parts.

The conductive intermediate layer may be formed in consideration of its function of enhancing "solder wettability" between the solder material and the conductive intermediate layer in addition to the function of restricting the "solder leaching" phenomenon.

Conventionally, for the conductive intermediate layer, a bulk metal layer 3 formed on a conductive circuit layer 2 by a plating method is disclosed in Patent Document 1, for example.

Patent Document 2 discloses therein a technique for vacuum-depositing a metal such as copper on a circuit conductor layer 4 thereby to form a conductive metal layer 6 corresponding to the conductive intermediate layer.

RELATED ART DOCUMENTS

Patent Documents

Patent Document 1: Japanese Patent Application Laid-Open No. 6-120643
Patent Document 2: Japanese Patent Application Laid-Open No. 61-58289

DISCLOSURE OF THE INVENTION

Problem to be Solved by the Invention

As described above, Patent Document 1 and Patent Document 2 describe therein the bulk metal layer 3 and the conductive metal layer 6 corresponding to the conventional conductive intermediate layers, respectively.

However, when the conductive intermediate layer (the bulk metal layer 3) is formed by an electrolytic plating method as disclosed in Patent Document 1, a plated lead for conduction is previously formed inside a wiring circuit as final product in many cases. Since the plated lead is not required as the wiring circuit of the product, a wiring circuit board inevitably increases in size by the area of the plated lead. Consequently, there is a problem that it is actually difficult to meet an increasingly-desired demand for high-density circuit formation in recent years.

On the other hand, when an electroless plating method is used to form the conductive intermediate layer (the bulk metal layer 3), the plated lead does not need to be formed. However, the wiring circuit board has to be exposed to severe environments such as high temperature and strong acid bath during the plating step for a long time. Thus, the wiring circuit board can be largely damaged. Further, a plated layer may be generated also on other than the wiring circuit such as an insulative base material or insulative cover (cover coat) depending on a plating condition. Thus, there may occur a problem that it is not possible to form the conductive intermediate layer only at desired sites.

When the conductive intermediate layer (the conductive metal layer 6) is formed by a vacuum deposition method as disclosed in Patent Document 2, the wiring circuit board needs to be masked and then be thrown into a vacuum chamber. Thus, the manufacturing steps are complicated and continuous machining is difficult. Further, in order to form a layer thick enough to exercise a sufficient function as the conductive intermediate layer, a depositing time needs to be prolonged and power consumption needs to be increased. Thereby, the method for forming the conductive intermediate layer by the vacuum deposition method is not suitable for mass production, and thus is less practical.

The present invention has been made in terms of the above problems, and its object is to form a conductive intermediate layer needed for mounting various electronic parts on a wiring circuit board by use of a solder material with an environmentally-friendly method and with excellent productivity.

Means for Solving the Problem

In order to achieve the above object, the present application provides the following inventions.

The invention for a wiring circuit board according to the present application provides a wiring circuit board including an insulative base material, a wiring circuit pattern formed on at least one surface of the insulative base material, an electronic part mounting land which is formed as part of the wiring circuit pattern and to which electronic parts are bonded by a solder material, and a conductive intermediate layer made of a sintered conductive ink film on the electronic part mounting land.

The invention for a method for manufacturing a wiring circuit board according to the present application provides a method for manufacturing a wiring circuit board including preparing an insulative base material, forming a wiring circuit pattern having an electronic part mounting land to which electronic parts are to be bonded by a solder material on at least one surface of the insulative base material, stacking multiple discharged droplets of a conductive ink containing a conductive material in a partially and mutually-overlapped manner by use of a droplet discharging method thereby to form a droplet film on the electronic part mounting land, and sintering the droplet film thereby to form a conductive intermediate layer.

Effects of the Invention

According to the present invention, the following effects can be obtained.

Since the conductive intermediate layer is formed on the electronic part mounting land in the wiring circuit board according to the present invention, the "solder leaching" phenomenon can be maximally prevented, thereby bonding the electronic parts with high reliability.

Since the conductive intermediate layer is formed without the need of the plating method, the problems of the related art are eliminated. In other words, according to the present invention, it is possible to dispense with formation of the plated lead needed for the electrolytic plating method. Thereby the wiring circuit board suitable for high-density mounting can be obtained. According to the present invention, it is possible to eliminate a damage on the wiring circuit board due to a strong condition of the plating, which was not be able to be avoided by the electroless plating method. Further, according to the present invention, a large amount of drug solution is not required and thus a load on the environment is remarkably low.

Furthermore, according to the present invention, it is possible to quickly form the conductive intermediate layer only on desired electronic part mounting lands on the wiring circuit pattern. Therefore, an effect that productivity is remarkably excellent can be obtained.

MODES FOR CARRYING OUT THE INVENTION

Figure 1A:
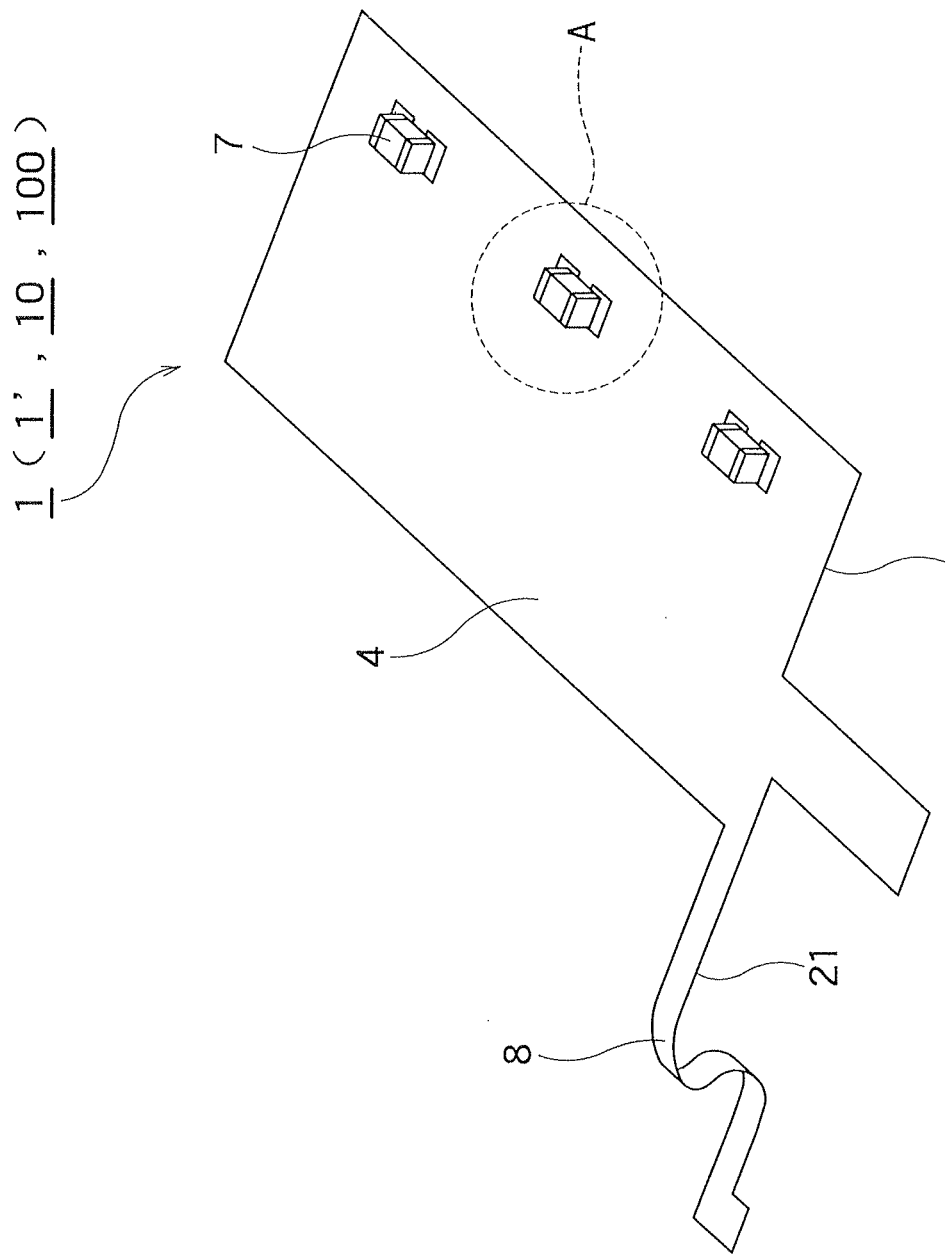
FIG. 1A is a perspective view schematically showing an entire wiring circuit board according to the present invention.

Three embodiments according to the present invention will be described below with reference to the drawings. Same reference numerals are assigned to constituents having the same function and a detailed explanation thereof will not be repeated.

First Embodiment

A wiring circuit board according to a first embodiment of the present invention will be described with reference to FIGS. 1A to 4.

Figure 1B:
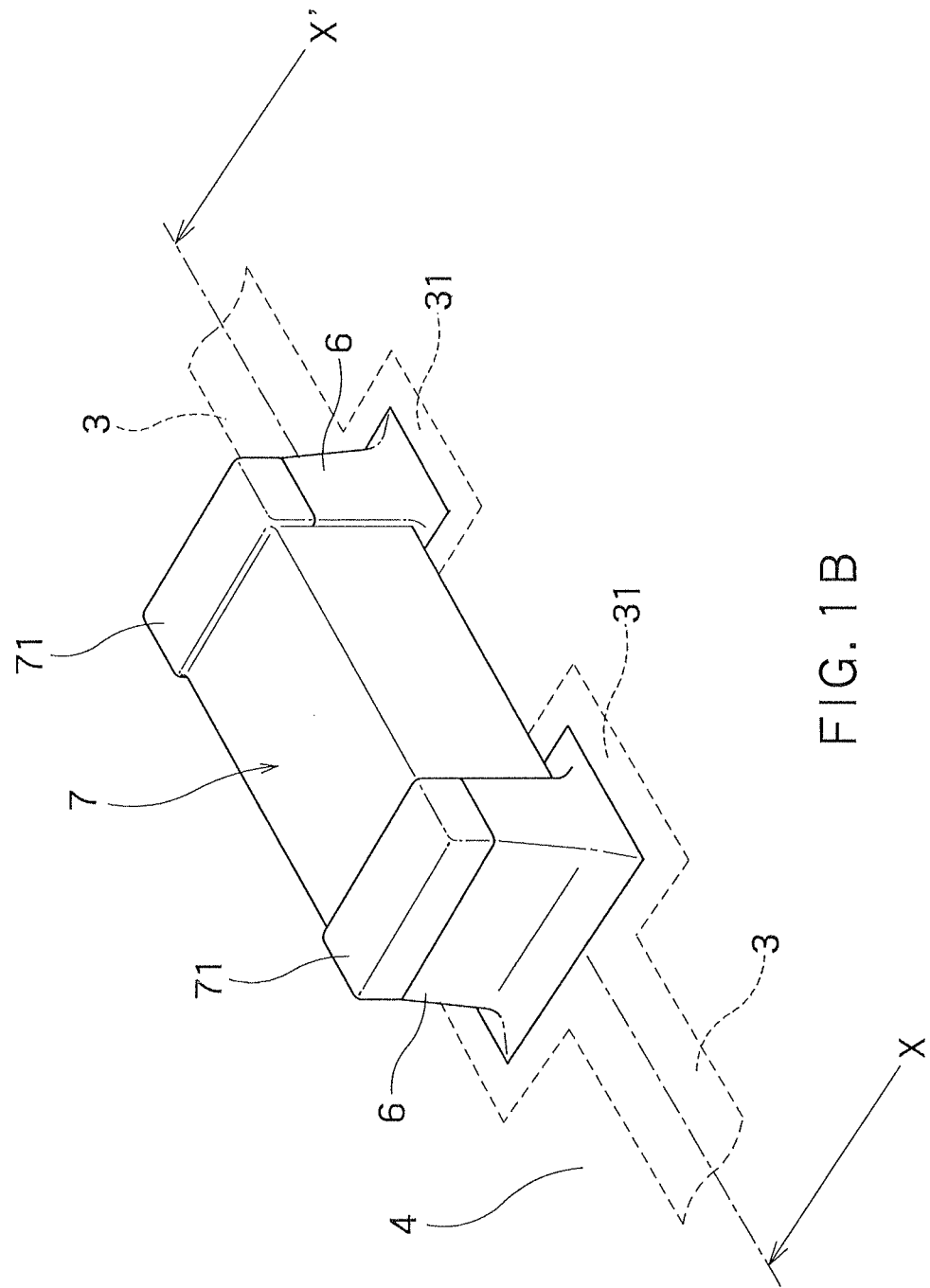
FIG. 1B is a perspective view in which part A in FIG. 1A is enlarged.
Figure 2:
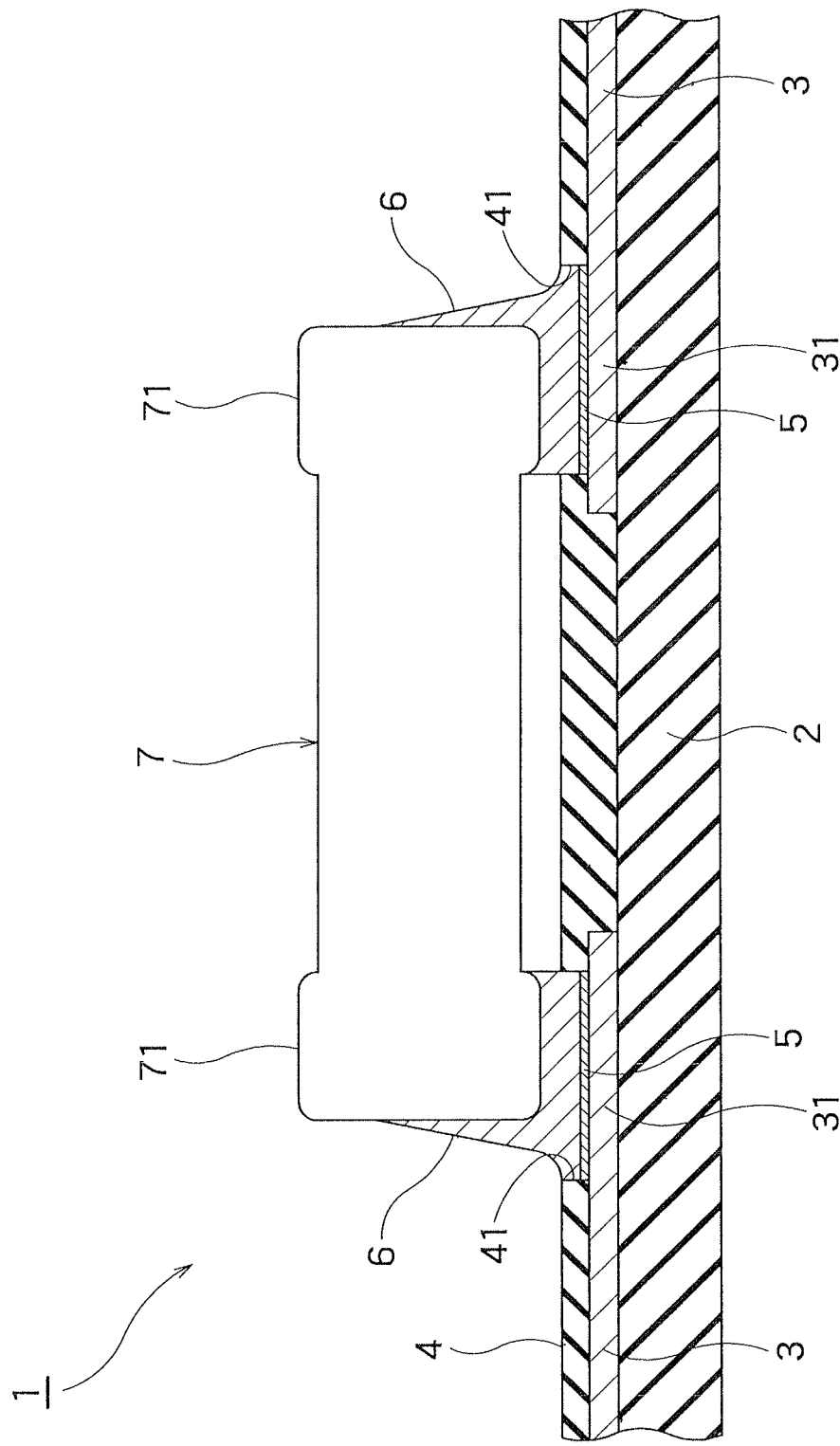
FIG. 2 is a cross-sectional explanatory view in which the wiring circuit board according to a first embodiment of the present invention is cut along X-X' line of FIG. 1B except for an electronic part 7.
Figure 3:
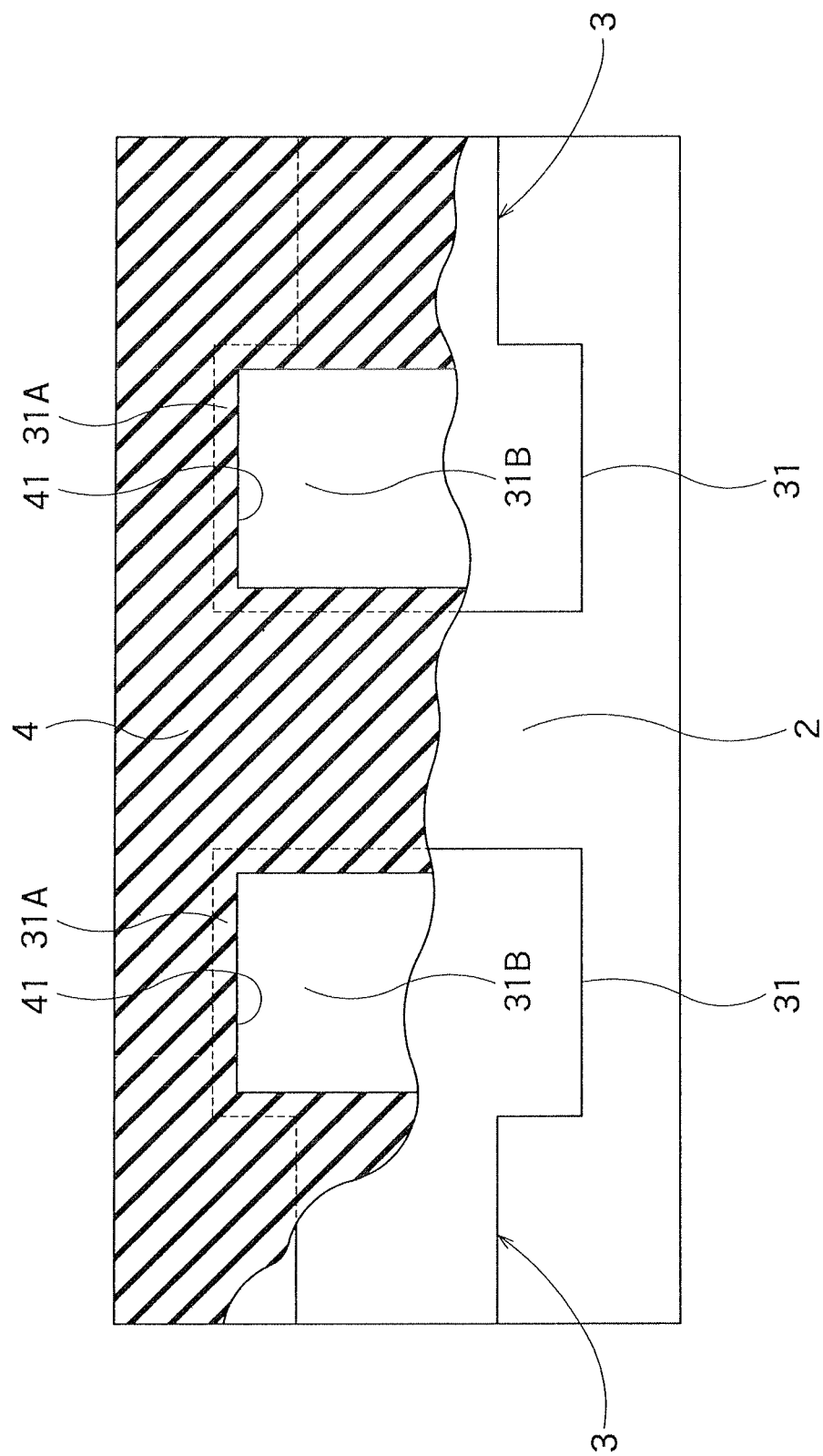
FIG. 3 is a plan explanatory view of the wiring circuit board showing an insulative base material and a wiring circuit pattern in a plane with part of a cover coat released.

FIG. 1A is a perspective view schematically showing an entire wiring circuit board according to the present invention. FIG. 1B is a perspective view in which part A in FIG. 1A is enlarged. FIG. 2 is a cross-sectional explanatory view in which the wiring circuit board according to the first embodiment of the present invention is cut along X-X' line of FIG. 1B. FIG. 3 is a plan explanatory view of the wiring circuit board in which an insulative base material 2 and a wiring circuit pattern 3 (electronic part mounting land 31) are shown in a plane with part of a cover coat 4 released.

As can be seen from FIG. 1A, FIG. 1B and FIG. 2, the wiring circuit board 1 according to the present embodiment has the insulative base material 2 (FIG. 1A, FIG. 2), the wiring circuit pattern 3 formed as a desired pattern on the insulative base material 2 (FIG. 1B, FIG. 2), the electronic part mounting land 31 provided as part of the wiring circuit pattern 3 (FIG. 1B, FIG. 2), the cover coat 4 which coats desired sites of the wiring circuit pattern 3 (FIG. 1A, FIG. 1B, FIG. 2), a conductive intermediate layer 5 formed on the electronic part mounting land 31 (FIG. 2), and a flexible cable 8 extending to a side of the wiring circuit board 1 (FIG. 1A).

The respective members configuring the wiring circuit board 1 will be described below in detail.

The insulative base material 2 has polyimide resin as main material. Thereby, a thermal resistance needed for mounting an electronic part 7 by a solder material 6 on the electronic part mounting land 31 (FIG. 2) is ensured. The insulative base material 2 may have a desired thickness in the range of 12.5 μm to 125 μm. A reinforcing plate or the like can be attached to the backside (the lower surface in FIG. 2) of the insulative base material 2, for example, for ensuring flatness of the board when mounting the electronic part 7. The insulative base material 2 has two vertically-facing surfaces, and at least the surface (the upper surface in FIG. 2) on which the wiring circuit pattern 3 is formed is desirably subjected to plasma processing, corona processing, UV ozone processing, alkali etching processing or the like before forming the wiring circuit pattern 3. With the processings conducted, an adhesion strength between the insulative base material 2 and the wiring circuit pattern 3 can be enhanced.

When the wiring circuit board 1 does not have the flexible cable 8, not only a substrate having the polyimide resin as main material but also a glass epoxy substrate or phenol substrate may be employed as the insulative base material 2.

The wiring circuit pattern 3 is formed by printing a conductive paste mixing conductive powder and a binder therein on the insulative base material 2 according to a desired pattern and then thermally hardening the conductive paste. There may be used, as the conductive powder, copper (Cu) powder, silver (Ag) powder, or copper (Cu)-silver (Ag) alloy powder, which has a desired shape such as flake shape, spherical shape or needle shape and has a diameter of powder particle ranging from several nm to 50 μm. For reducing a circuit resistance of the wiring circuit pattern 3, Ag is desirably selected as the material of the wiring circuit pattern 3. When the wiring circuit board 1 is used as a flexible circuit board, a conductive paste containing more flake-shaped conductive powder is desirably used for restricting an increase in resistance value also when the wiring circuit board 1 is bent. Of course, conductive powder in combination of various materials, shapes and powder particle diameters may be used depending on a demanded property.

Resin components of the conductive paste may desirably include polyimide resin, polyamide-imide resin and the like. The wiring circuit pattern 3 formed of such a conductive paste has a thermal resistance needed for mounting the electronic part 7 by the solder material 6 like the insulative base material 2.

The wiring circuit pattern 3 made of such a material is formed to have a desired circuit configuration by a screen printing method. The precursors of the resin components (polyimide resin, polyamide-imide resin) of the conductive paste are desirably diluted by a solvent such as DMF, NMP or γ-butyrolactone soluble for the precursors. Thereby, a fluidity of the conductive paste is adapted to the screen printing method and thus the screen printing method can be employed.

Epoxy-based resin, phenol-based resin, acryl-based resin or mixture thereof having a thermal resistance to solder may be employed as the resin component of the conductive paste in addition to the polyimide resin or polyamide-imide resin. With the resins, a paste having excellent printability can be obtained as compared with the polyimide resin or polyamide-imide resin.

The pattern thickness of the wiring circuit pattern 3 may have an arbitrary value in consideration of a demanded circuit resistance and the like. For example, when a wiring circuit board having a low resistance is demanded, the pattern width or pattern thickness of the wiring circuit pattern 3 may be only increased.

In order to reduce the circuit resistance by increasing the pattern width, the printing method such as flexographic printing, offset printing, gravure printing or inkjet printing may be employed in addition to the screen printing.

On the other hand, in order to reduce the circuit resistance by increasing the pattern thickness, the use of the screen printing method capable of obtaining the pattern thickness up to about 20 μm in a single printing step is so excellent in production efficiency.

In order to form the wiring circuit pattern 3 by the screen printing method, there is an advantage that the total steps of manufacturing the wiring circuit board 1 are processed in a dry process including the steps of forming the conductive intermediate layer 5 described later, thereby further reducing environment loads.

In consideration of the object and nature of the present invention, it is clear that the material and manufacturing method of the wiring circuit pattern 3 may be pattern formation by etching copper foil or pattern formation by a plating method, for example.

As shown in FIG. 1B and FIG. 2, the electronic part mounting land 31 is configured to be electrically connectable to external terminal electrodes 71 of the electronic part 7 described later. In other words, as can be seen from FIG. 2, the electronic part 7 is mounted on the electronic part mounting lands 31 via the conductive intermediate layer 5 by the solder material 6. The shape and size of the electronic part mounting lands 31, 31 are adapted to the shape and size of the external terminal electrodes 71, 71 of the mounted electronic part 7.

As can be seen from FIG. 3 for explaining a plane pattern, surface peripheral parts 31A, 31A of the electronic part mounting lands 31, 31 are coated with the cover coat 4 having openings 41, 41 detailed later to be pressed, and surface center parts 31B, 31B of the electronic part mounting lands 31, 31 are exposed. In other words, the surface peripheral part 31A of the electronic part mounting land 31 is coated with the cover coat 4 to be pressed. Thereby, even when a shear stress is applied after the electronic part 7 is mounted on the electronic part mounting land 31, it is possible to maximally avoid a possibility that the electronic part mounting land 31 is released from the insulative base material 2.

As can be seen from FIG. 3, the cover coat 4 is provided with the openings 41. The cover coat 4 has a function of preventing the wiring circuit pattern 3 from deteriorating or being damaged due to external causes in addition to the function of restricting the release of the wiring circuit pattern 3 described above by coating the wiring circuit pattern 3. When the wiring circuit board 1 functions as a flexible circuit board, the bent part (such as flexible cable 8 described later) of the wiring circuit board 1 is desirably coated with the cover coat 4. Thereby, when the part to be bent is bent, it is possible to reduce a possibility that the wiring circuit pattern 3 is disconnected.

Polyimide resin or polyamide-imide resin is used as a main material of the cover coat 4. Thereby, the cover coat 4 has a thermal resistance needed for mounting the electronic part 7 by the solder material 6. Similar to the conductive paste used for forming the wiring circuit pattern 3, the precursors of the polyimide resin and the polyamide-imide resin are diluted by a polar solvent such as DMF, NMP or γ-butyrolactone and thus a fluidity of the paste can be ensured. Thereby, the cover coat 4 can be formed by the screen printing method.

Epoxy-based resin, fluorine-based resin, modified-urethane-based resin or mixture thereof having a thermal resistance to solder may be employed as a main material of the cover coat 4 in addition to the polyimide resin or polyamide-imide resin.

As another method for forming the cover coat 4, there may be employed a method for removing desired sites of a cover film by punch-through machining and then bonding them to coat the insulative base material 2 and the wiring circuit pattern 3.

The thickness of the cover coat 4 may be selected to be adapted to a demanded specification of the wiring circuit board 1 as needed. In the embodiment of the present invention, the thickness of the cover coat 4 is 20 μm or more. Thereby, when the wiring circuit board 1 is used as a flexible circuit board, it is possible to restrict the disconnection of the wiring circuit pattern 3 and to restrict or reduce electromigration. Further, when forming the conductive intermediate layer 5 detailed later, that is, when making a film of a conductive ink by an inkjet printing method thereby to form the conductive intermediate layer 5, the openings 41 of the cover coat 4 can serve as a so-called dam which prevents the conductive ink having a fluidity from flowing out to the surroundings thereby to store the conductive ink in the openings 41. Consequently, it is advantageous that the conductive intermediate layer 5 can be easily formed.

The flexible cable 8 shown in FIG. 1A functions as a cable of the wiring circuit board 1, and is directed for connecting the wiring circuit board 1 to an external electronic device or other wiring circuit board. As can be seen from FIG. 1A, the flexible cable 8 is such that a wiring pattern (not shown) is formed on an insulative base material extension 21 integrally extended from the insulative base material 2 and part of the cover coat 4 is formed on the wiring pattern. Since a reinforcing plate is not attached to the flexible cable 8, the flexible cable 8 can be freely bent. Further, since the cover coat 4 coats the wiring pattern, the disconnection of the wiring pattern can be restricted even when the flexible cable 8 is bent.

The aforementioned conductive intermediate layer 5 will be described below in detail with reference to FIG. 2. As can be seen from FIG. 2, the conductive intermediate layer 5 is formed on the electronic part mounting land 31. The conductive intermediate layer 5 is formed as follows. First, a conductive ink which is made by adding a dispersant to nickel (Ni) as main conductive material (which will be referred to as Ni ink below) is applied (dropped) onto the electronic part mounting land 31 to form a conductive ink film (Ni ink film). Herein, the conductive ink is called nano ink, and more specifically is an ink in which nano-order metal particles are coated with the dispersant and are uniformly dispersed into an organic solvent. The film made of the conductive ink is heated so that the dispersant and the organic solvent are evaporated and the metal particles are sintered each other, thereby obtaining a conductive thin film. Since the metal particles are as small as nano-order, one property may be that a sintering temperature is low.

Figure 4:
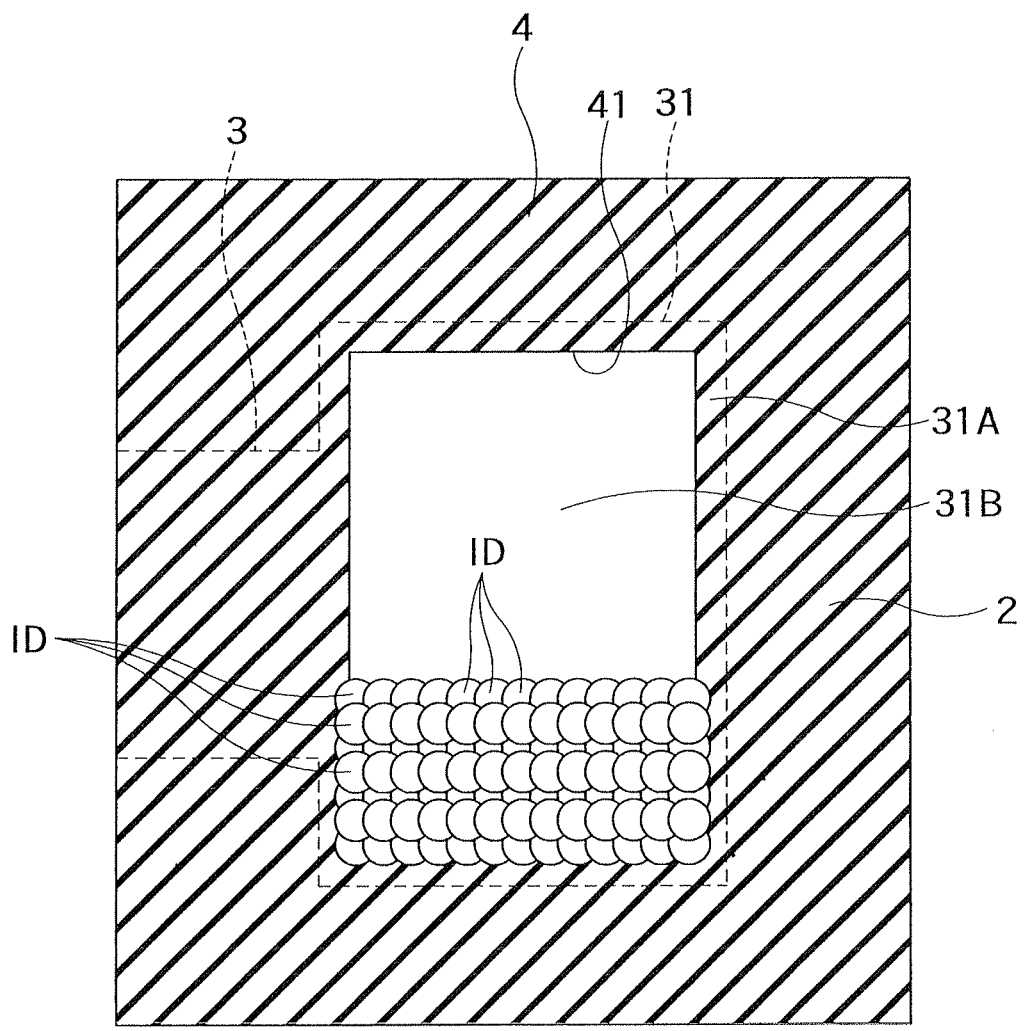
FIG. 4 is a plan view of the wiring circuit board in the middle of steps for explaining a step of forming a conductive ink film by an inkjet printing method.

The formation of the conductive ink film (Ni ink film) will be described herein in detail with reference to FIG. 4. FIG. 4 is a plan view of the wiring circuit board in the middle of steps for explaining the step of forming the conductive ink film by an inkjet printing method. As shown in FIG. 4, discharged droplets ID (Ink Drop) of the conductive ink discharged from a nozzle of an inkjet printer are stacked on the electronic part mounting land 31 in an overlapped manner. In other words, the discharged droplets ID are stacked to be partially overlapped on each other. Thereby, the Ni ink film is formed as a dense droplet film on the surface center part 31B of the electronic part mounting land 31. In order to fully coat the electronic part mounting lands 31 exposed at the bottom surfaces of the openings 41 of the cover coat 4 with the Ni ink film, as shown in FIG. 4, part of the discharged droplets ID of the conductive ink may reach the cover coat 4.

After the Ni ink film is formed, the Ni ink film is sintered in an inert gas atmosphere such as nitrogen for preventing the Ni ink film from being oxidized. Thereby, nickel particles in the Ni ink film are combined so that the conductive intermediate layer 5 as low-resistant film is formed. In order to reduce thermal damages on the wiring circuit board 1, it is preferable that the conductive intermediate layer 5 is formed by sintering the Ni ink film by use of a plasma sintering technique or a pressure sintering technique at a heatproof temperature or less of the insulative base material 2, the wiring circuit pattern 3 and the cover coat 4, preferably at 260° C. or less.

With the above method, the conductive intermediate layer 5 is formed as a metal thin layer having no microscopic pore. Thus, it is possible to surely prevent the "solder leaching" of the wiring circuit pattern 3 into the solder material 6.

In order to surely discharge the conductive ink by the inkjet printing method, it is preferable that the particle diameter of the conductive material contained in the conductive ink is 500 nm or less. Further, for more excellent electric property or lower sintering temperature, the particle diameter is desirably adjusted to 300 nm or less.

The lower limit of the thickness of the conductive intermediate layer 5 is about 200 nm. With this thickness or more, the "solder leaching" of the wiring circuit pattern 3, which occurs when mounting the electronic part 7 on the wiring circuit board 1 by the solder material 6, can be prevented. In order to more surely prevent the "solder leaching", the thickness of the conductive intermediate layer 5 is desirably set at about 400 nm or more. On the other hand, in consideration of the possibility (such as productivity) of the film formation by the inkjet printing method, the upper limit of the thickness of the conductive intermediate layer 5 is desirably set at about 5 μm.

The electronic part 7 to be mounted on the wiring circuit board 1 will be described below. As shown in FIG. 2, the electronic part 7 is mounted on the electronic part mounting land 31 via the conductive intermediate layer 5. As can be seen from FIG. 1B and FIG. 2, the electronic part 7 includes the external terminal electrodes 71, 71 at its both ends. The electronic part 7 is of surface mount type such as ceramic chip capacitor or LED. The external terminal electrode 71 of the electronic part 7 is made of hardened or sintered Ag paste (conductive paste containing silver (Ag) as conductive powder). In order to enhance bondability by the solder material 6, the surface of the external terminal electrode 71 is coated with a plated layer (not shown) made of nickel-tin (Ni—Sn).

Figure 5:
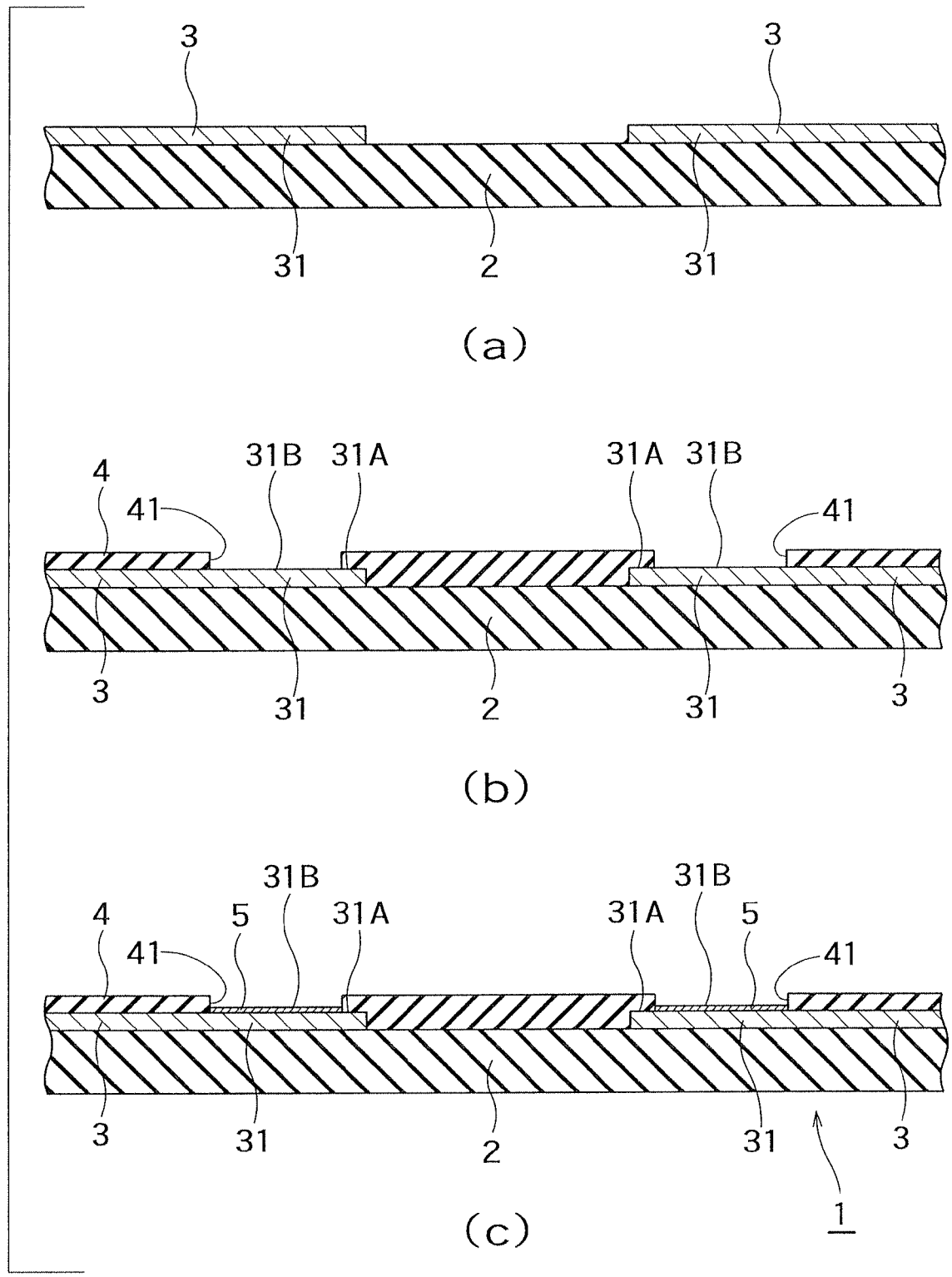
FIG. 5 is a process cross-sectional view for explaining a method for manufacturing the wiring circuit board according to the first embodiment of the present invention.

A method for manufacturing the wiring circuit board 1 according to the present embodiment will be described below with reference to FIG. 5. FIG. 5 is a process cross-sectional view for explaining the method for manufacturing the wiring circuit board 1.

(1) As can be seen from FIG. 5(*a*), first, the insulative base material 2 is prepared and the wiring circuit pattern 3 having the electronic part mounting lands 31 is formed on the surface (top surface) of the insulative base material 2 by use of the screen printing method, for example.

(2) Then, as can be seen from FIG. 5(*b*), for example, the screen printing method is used to form the cover coat 4 on the wiring circuit pattern 3 (except for the surface center parts 31B of the electronic part mounting lands 31) and the insulative base material 2. As described above, the cover coat 4 is provided with the openings 41 and the surface center parts 31B of the electronic part mounting lands 31 are exposed at the bottom surfaces of the openings 41.

(3) Then, as can be seen from FIG. 5(*c*), the conductive intermediate layer 5 is formed on the surface center part 31B of the electronic part mounting land 31. More specifically, as described above, the discharged droplets of the conductive ink containing the conductive material (Ni) are first stacked to be partially overlapped on each other by the inkjet printing method (see FIG. 4) thereby to form a conductive ink film (droplet film) on the electronic part mounting land 31. Thereafter, the conductive ink film is sintered thereby to form the conductive intermediate layer 5.

Through the above steps, the wiring circuit board 1 according to the present embodiment is completed.

The steps of mounting the electronic part 7 on the wiring circuit board 1 will be described below with reference to FIG. 6 and FIG. 2.

Figure 6:
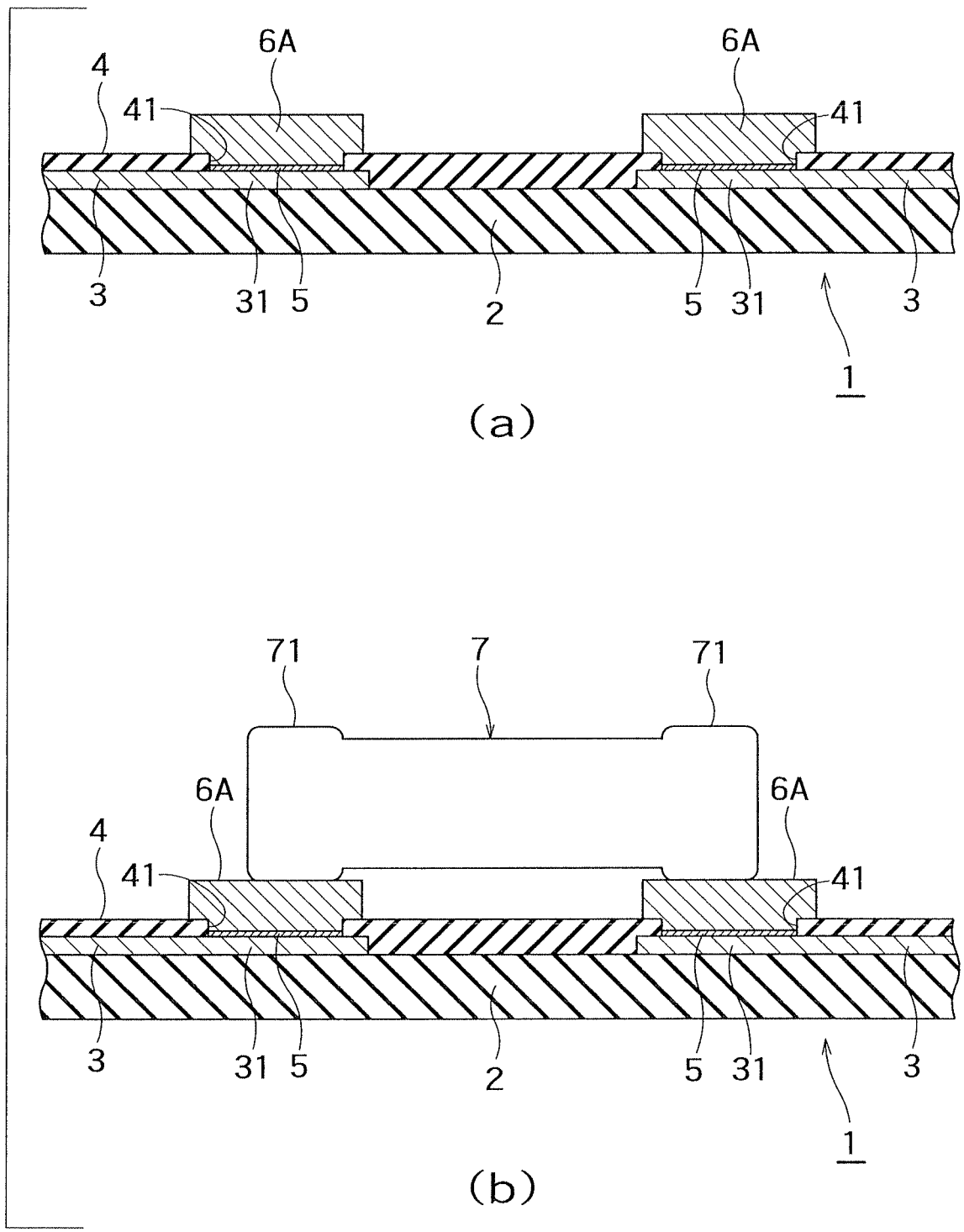
FIG. 6 is a process cross-sectional view for explaining a method for bonding electronic parts to the wiring circuit board according to the first embodiment of the present invention.

(1) As can be seen from FIG. 6(*a*), a cream solder 6A is applied onto the conductive intermediate layer 5 and its surroundings of the cover coat 4. The cream solder is a mixture of solder powder and liquid flux.

In the present embodiment, for example, ethyleneamines and/or amine halogenated hydroacid salt may be used as an activator contained in the flux of the cream solder 6A. In consideration of an environment resistance, an activator made of ethyleneamines is desirably used. Thereby, wettability and bondability between the conductive intermediate layer 5 obtained by sintering the Ni ink film and the solder material 6 can be more ensured.

(2) Then, as can be seen from FIG. 6(*b*), the electronic part 7 is placed on the wiring circuit board 1 such that the external terminal electrodes 71, 71 of the electronic part 7 contact the cream solder 6A, 6A.

(3) Then, while the electronic part 7 is being placed on the cream solder 6A, the heating processing (reflow) is performed to melt the cream solder 6A. Thereby, as shown in FIG. 2, the electronic part 7 is electrically and mechanically connected to the electronic part mounting land 31 via the conductive intermediate layer 5 by the solder material 6 (melted cream solder 6A).

As described above, the wiring circuit board 1 has the conductive intermediate layer 5 made by sintering the Ni ink film formed on the electronic part mounting land 31. Thereby, according to the present embodiment, the "solder leaching" of the wiring circuit pattern 3 into the solder material 6, which occurs when mounting the electronic part 7 on the wiring circuit board 1, can be surely prevented and the electronic part 7 can be bonded with high reliability.

Further, since the Ni ink film is formed by the inkjet printing method capable of selectively discharging the droplets only on desired areas according to the present embodiment, the productivity is so excellent and a large amount of drug solution is not required unlike a conventional plating method, thereby obtaining an effect that a load on the environment is so low. The plated lead does not need to be formed, thereby obtaining the wiring circuit board on which a high-density circuit can be formed.

Furthermore, according to the present embodiment, the conductive intermediate layer 5 is made of only one layer of Ni ink film, and the electronic part 7 can be bonded while maximally preventing the "solder leaching." This is so advantageous for productivity and cost.

Figure 7:
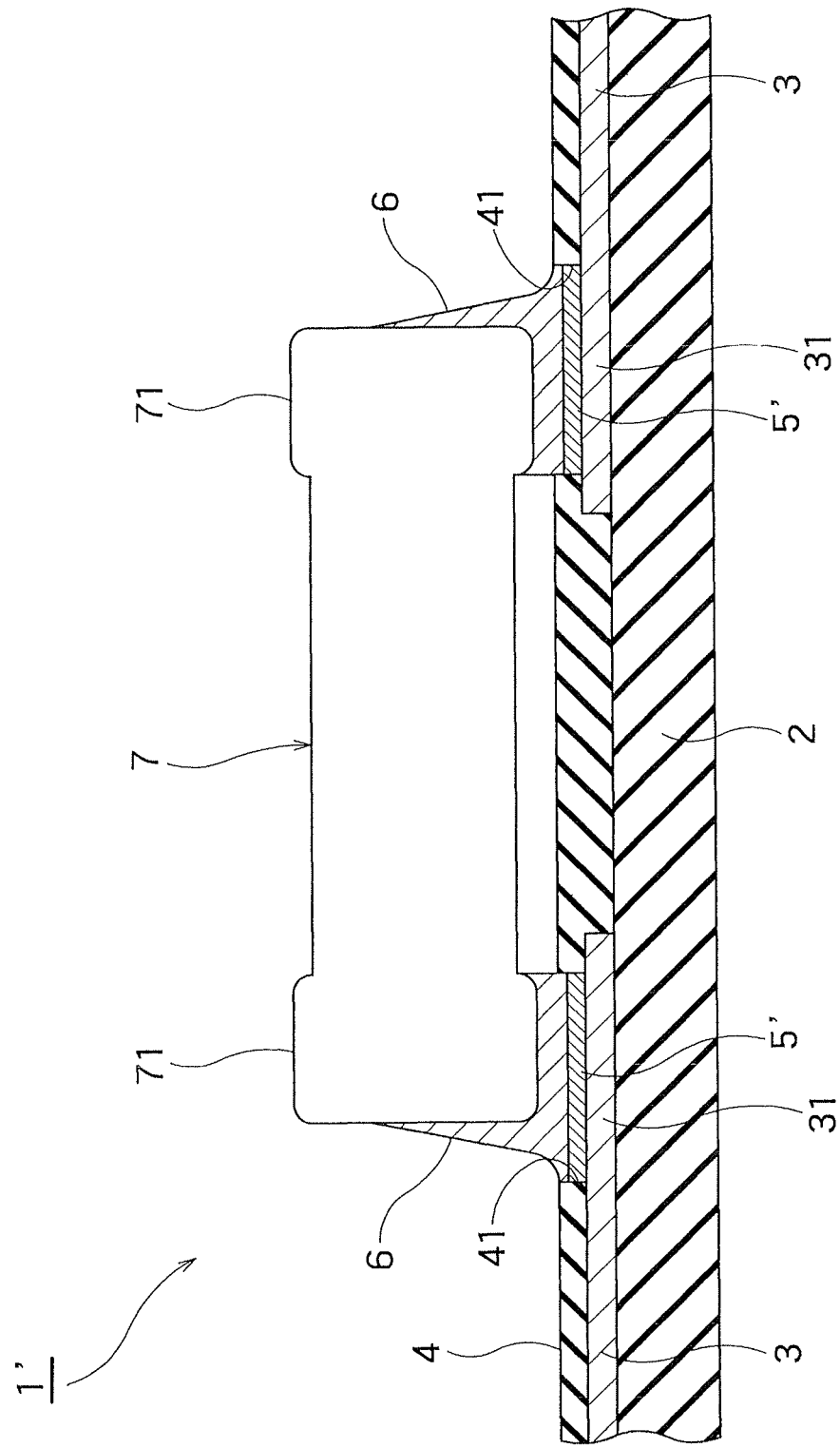
FIG. 7 is a cross-sectional explanatory view of the wiring circuit board corresponding to FIG. 2 for explaining a variant of the first embodiment of the present invention.

A wiring circuit board 1' according to a variant of the present embodiment will be described below with reference to FIG. 7. The wiring circuit board 1' has a conductive intermediate layer 5' made by sintering a Cu ink film instead of the conductive intermediate layer 5 made by sintering the Ni ink film, as can be seen from FIG. 7. Herein, the Cu ink film is formed by applying a conductive ink (Cu ink), which is made by adding a dispersant to copper (Cu) as main conductive material, on the electronic part mounting land 31 in a similar manner to the Ni ink film. The conductive intermediate layer 5' is formed as a metal thin layer having no microscopic pore by sintering the Cu ink film at 260° C. or less, for example, in an inert gas atmosphere. In order to enhance a reduction action of the Cu ink film, a hydrogen gas may be added to the inert gas atmosphere during the sintering.

The function of preventing the "solder leaching" of the conductive intermediate layer 5' made of the sintered Cu ink film is inferior to that of the conductive intermediate layer 5 made of the sintered Ni ink film. However, the thickness of the conductive intermediate layer 5' is 500 nm or more, which is larger than the Ni ink film, so that an alloy layer is formed near the interface between the solder material 6 and the conductive intermediate layer 5' when mounting the electronic part 7 and the alloy layer can prevent the "solder leaching" of the conductive intermediate layer 5' into the solder material 6 from excessively advancing. The thickness of the conductive intermediate layer 5' is relatively increased in this way thereby to be practical enough to obtain a similar effect as the conductive intermediate layer 5.

As one advantage of the variant, the conductive intermediate layer 5' is excellent in "wettability" with the solder material 6. Thus, according to the variant, the cream solder containing typical flux can be employed as the cream solder 6A, which enables a more excellent process in versatility.

According to a further variant of the present embodiment, a conductive ink containing a silver-palladium alloy (Ag—Pd alloy) as main conductive material may be used instead of Ni ink and Cu ink. Also in this case, the above effects can be obtained.

Second Embodiment

Figure 8:
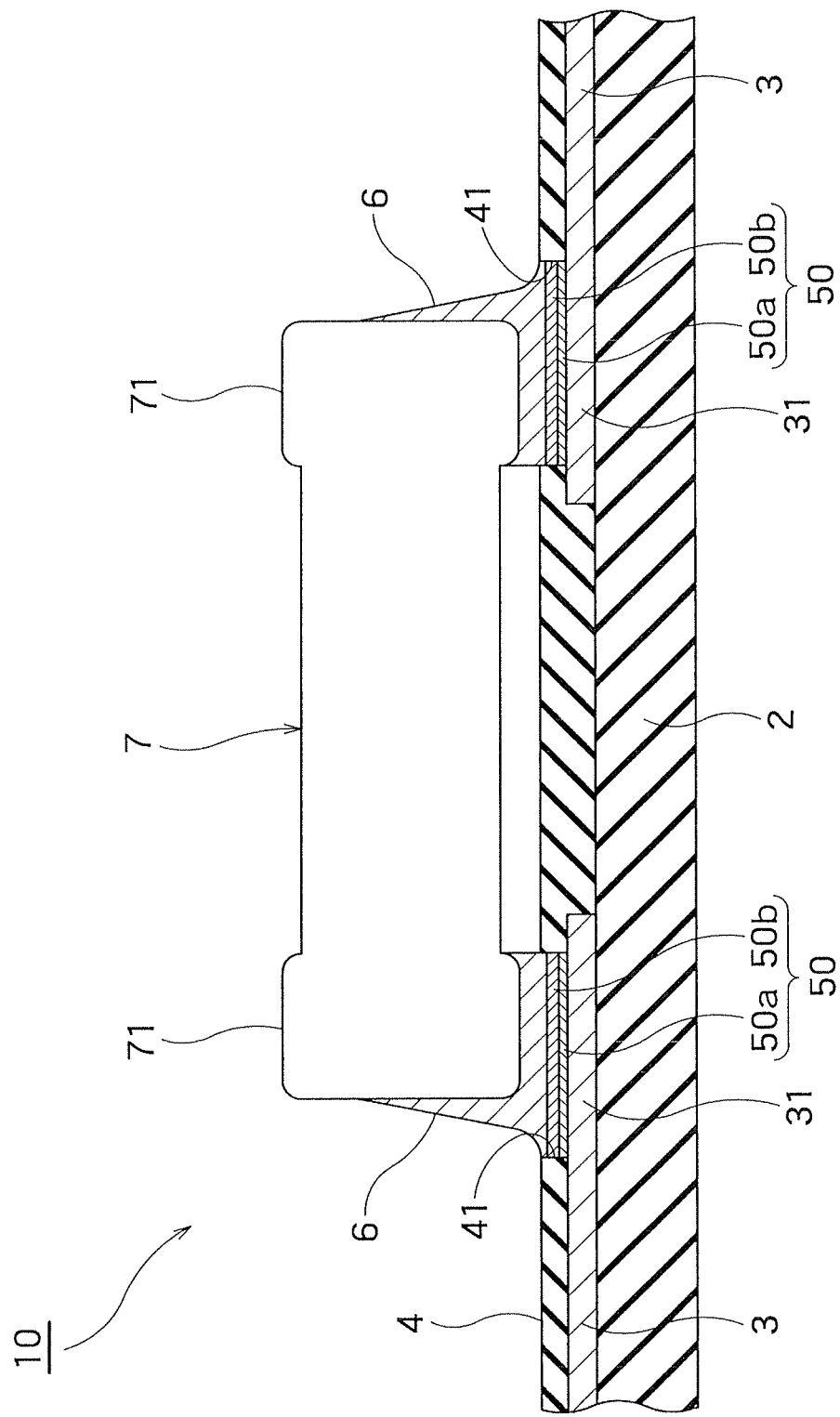
FIG. 8 is a cross-sectional explanatory view in which a wiring circuit board according to a second embodiment of the present invention is cut along X-X' line of FIG. 1B except for the electronic part 7.

A second embodiment according to the present invention will be described below with reference to FIG. 8. FIG. 8 is a cross-sectional explanatory view of a wiring circuit board 10 according to the second embodiment. The second embodiment is different from the first embodiment in the structure of the conductive intermediate layer. The wiring circuit board according to the first embodiment has the conductive intermediate layer made of one layer of sintered conductive ink film, while the wiring circuit board according to the second embodiment has a conductive intermediate layer made of two layers of sintered conductive ink films.

In other words, as can be seen from FIG. 8, the conductive intermediate layer 50 of the wiring circuit board 10 according to the present embodiment has a configuration in which a first conductive intermediate layer 50*a* and a second conductive intermediate layer 50*b* are sequentially stacked on the electronic part mounting land 31. The first conductive intermediate layer 50*a* is a sintered Ni ink film formed by applying an Ni ink like the conductive intermediate layer 5 according to the first embodiment. The second conductive intermediate layer 50*b* is made by applying a conductive ink (which will be referred to as Au ink below), which is made by adding a dispersant to gold (Au) as main conductive material, on the first conductive intermediate layer 50*a* thereby to form an Au ink film, and then sintering the Au ink film.

In other words, the conductive intermediate layer 50 is configured such that the two kinds of conductive intermediate layers including the first conductive intermediate layer 50*a* and the second conductive intermediate layer 50*b* are stacked and the second conductive intermediate layer 50*b* as sintered Au ink film is arranged as the uppermost layer. Thereby, the first conductive intermediate layer 50*a* as Ni thin film can maximally prevent the "solder leaching" of the wiring circuit pattern 3 into the solder material 6, and the second conductive intermediate layer 50*b* as Au thin film can sufficiently ensure the "solder wettability" to the solder material 6.

The conductive intermediate layer 50 according to the present embodiment is desirably formed according to the following procedure.

(1) Discharged droplets ID of an Ni ink are stacked in an overlapped manner on the electronic part mounting land 31 of the wiring circuit pattern 3 by the inkjet printing method thereby to form an Ni ink film. Thereafter, the Ni ink film is sintered at the heatproof temperature or less of the insulative base material 2, the wiring circuit pattern 3 and the cover coat 4, preferably at 260° C. or less. Thereby, the first conductive intermediate layer 50*a* as metal thin layer having no microscopic pore is obtained.

(2) Then, discharged droplets ID of an Au ink are stacked in an overlapped manner on the first conductive intermediate layer 50*a* by the inkjet printing method thereby to form an Au ink film. At this time, in order to obtain sufficient solder wettability, the Au ink film is desirably formed to fully coat the top surface of the first conductive intermediate layer 50*a*. Thereafter, the Au ink film is sintered at the heatproof temperature or less of the insulative base material 2, the wiring circuit pattern 3 and the cover coat 4, preferably at 260° C. or less. Thereby, the second conductive intermediate layer 50*b* as metal thin layer having no microscopic pore is obtained.

The first conductive intermediate layer 50*a* and the second conductive intermediate layer 50*b* are formed to be stacked according to the above procedure so that defects such as damage and diffusion of the conductive intermediate layer (the first conductive intermediate layer 50*a* and the second conductive intermediate layer 50*b*) can be prevented and adhesion between the first conductive intermediate layer 50*a* and the second conductive intermediate layer 50*b* can be ensured.

For example, the flying distance of the discharged droplets or the solvent of the discharged droplets is adjusted so that a degree of dry of the discharged droplets ID of the conductive ink can be controlled from the discharge of the conductive ink (Ni ink, Au ink) from the nozzle of the inkjet printer until the reach on the wiring circuit pattern 3 or the droplet film of the applied conductive ink. Thereby, the Ni ink film and the Au ink film can be continuously formed not through the sintering step. In other words, the degree of dry of the discharged droplets is controlled so that the Au ink film can be formed with the Ni ink film sintering step skipped after the Ni ink film is formed, and then the Ni ink film and the Au ink film can be collectively sintered. Thereby, the steps of forming the conductive intermediate layer 50 can be simplified.

The thicknesses of the first conductive intermediate layer 50a and the second conductive intermediate layer 50b will be described below. The lower limit of the thickness of the first conductive intermediate layer 50a is about 200 nm similar to the first embodiment. With the thickness or more, the "solder leaching" of the wiring circuit pattern 3, which occurs when mounting the electronic part 7 on the wiring circuit board 10 by the solder material 6, can be maximally prevented. In order to more surely prevent the "solder leaching", the thickness of the first conductive intermediate layer 50a is desirably set at about 400 nm or more. On the other hand, in consideration of the possibility (such as productivity) of the film formation by the inkjet printing method, the upper limit of the thickness of the first conductive intermediate layer 50a is desirably set at about 5 μm.

The thickness of the second conductive intermediate layer 50b is desirably around between 50 nm and 1 μm. Thereby, sufficient "solder wettability" to the solder material 6 can be ensured. Even when the thickness of the second conductive intermediate layer 50b is much smaller than the first conductive intermediate layer 50a, the "solder wettability" can be ensured. Thus, an increase in cost for the conductive intermediate layer 50 can be restricted.

As described above, according to the second embodiment of the present invention, the first conductive intermediate layer 50a made by sintering the Ni ink film formed on the electronic part mounting land 31 can maximally prevent the "solder leaching" of the wiring circuit pattern 3 into the solder material 6. Further, according to the present embodiment, the second conductive intermediate layer 50b made by sintering the Au ink film formed as the uppermost layer of the conductive intermediate layer 50 can sufficiently ensure the "solder wettability" to the solder material 6.

As can be seen from the above, in the present embodiment, the first conductive intermediate layer 50a having the function of preventing the "solder leaching" of the wiring circuit pattern 3 and the second conductive intermediate layer 50b having the function of enhancing the "solder wettability" are stacked to configure the conductive intermediate layer 50, thereby achieving multiple functions of the conductive intermediate layer.

Further, since the conductive ink film is formed by the inkjet printing method capable of selectively discharging the droplets only on desired areas similar to the first embodiment, according to the present embodiment, there can be obtained the effect that the productivity is so excellent and a large amount of drug solution is not required unlike a conventional plating method, thereby achieving so low load on the environment.

The second conductive intermediate layer 50b may be formed by use of an Ag ink (conductive ink made by adding a dispersant to silver as main conductive material) instead of the Au ink. Also in this case, the "solder wettability" can be improved.

Third Embodiment

Figure 9:
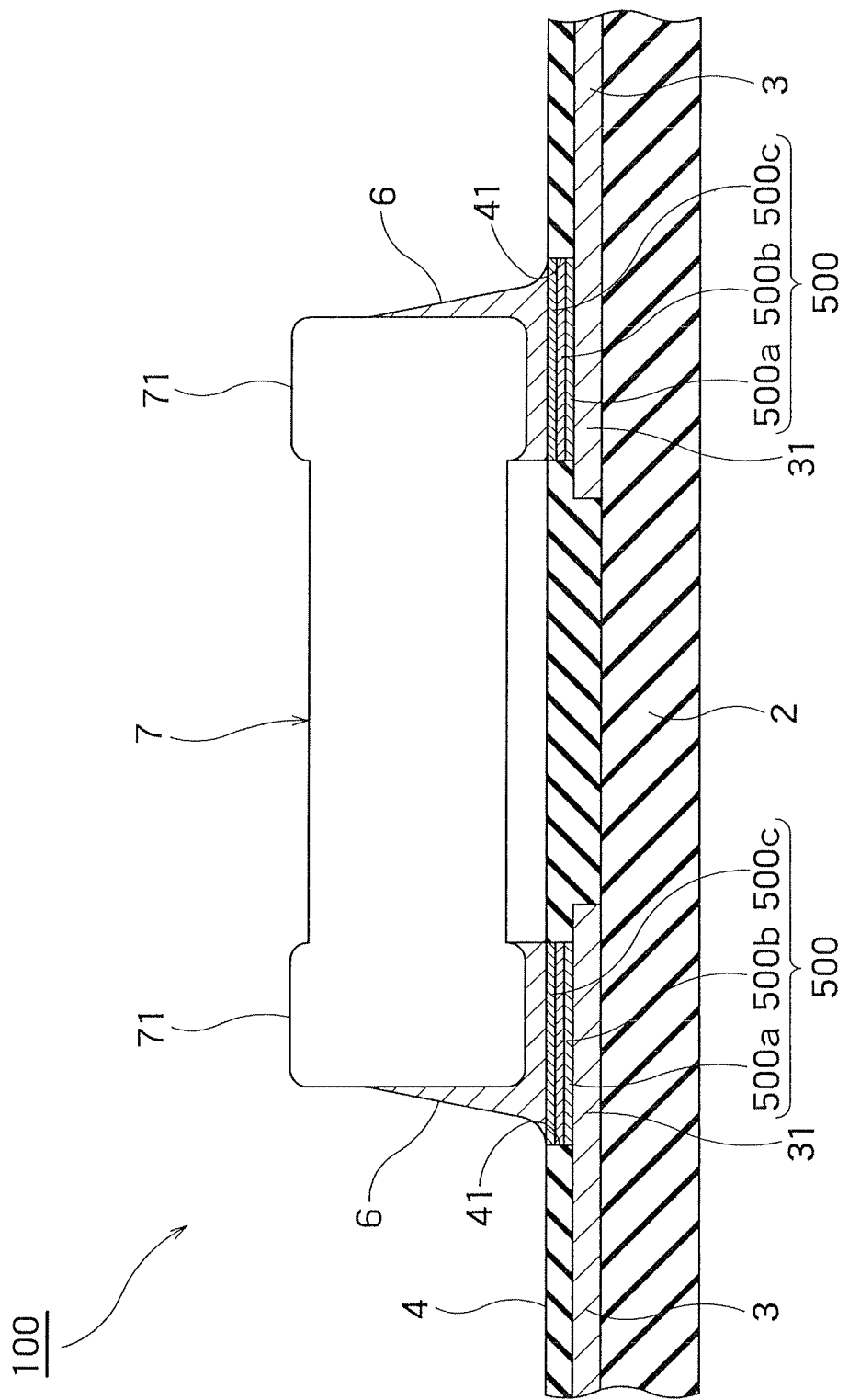
FIG. 9 is a cross-sectional explanatory view in which a wiring circuit board according to a third embodiment of the present invention is cut along X-X' line of FIG. 1B except for the electronic part 7.

A third embodiment according to the present invention will be described below with reference to FIG. 9. FIG. 9 is a cross-sectional explanatory view of a wiring circuit board 100 according to the third embodiment. The third embodiment is different from the second embodiment in the structure of the conductive intermediate layer. The wiring circuit board according to the second embodiment has the conductive intermediate layer made of two layers of sintered conductive ink films while the wiring circuit board according to the present embodiment has a conductive intermediate layer made of three layers of sintered conductive ink films.

In other words, as can be seen from FIG. 9, the conductive intermediate layer 500 of the wiring circuit board 100 according to the present embodiment is configured such that a first conductive intermediate layer 500a, a second conductive intermediate layer 500b and a third conductive intermediate layer 500c are sequentially stacked on the electronic part mounting land 31. The first conductive intermediate layer 500a is made by sintering a Cu ink film formed by applying a Cu ink on the electronic part mounting land 31. The second conductive intermediate layer 500b is made by sintering an Ni ink film formed by applying an Ni ink on the first conductive intermediate layer 500a. The third conductive intermediate layer 500c as the uppermost layer is made by sintering an Au ink film formed by applying an Au ink on the second conductive intermediate layer 500b.

The wiring circuit pattern 3 of the wiring circuit board 100 according to the present embodiment is formed by printing Ag paste on the insulative base material 2 according to a desired pattern and then thermally hardening the printed pattern.

The conductive intermediate layer 500 according to the present embodiment is formed similar to the conductive intermediate layer 50 explained in the second embodiment. In other words, the discharged droplets ID of the conductive ink may be stacked in an overlapped manner per layer by the inkjet printing method to form a conductive ink film and then the conductive ink film may be sintered at the heatproof temperature or less of the insulative base material 2, the wiring circuit pattern 3 and the cover coat 4, preferably at 260° C. or less. The sintering step may be performed per layer or may be collectively performed after the Au ink film is formed as the uppermost layer by controlling the degree of dry of the conductive ink as described in the second embodiment.

The effects of the conductive intermediate layer 500 of the wiring circuit board 100 according to the present embodiment will be described below.

As stated above, the wiring circuit pattern 3 of the wiring circuit board 100 according to the present embodiment contains a polyimide resin and a polyimide-imide resin as the resin components of the conductive paste. The polyimide resin and the polyamide-imide resin are known to be so excellent in thermal resistance and to have good water absorbability. Thus, for example, there is no problem when the wiring circuit board (the wiring circuit board 1, 10) according to the first embodiment and the second embodiment of the present invention is used in a low-humidity environment, but in a high-humidity environment, the polyimide resin and the polyamide-imide resin contained in the wiring circuit pattern 3 are permeable to water. Thus, Ag in the wiring circuit pattern 3 and Ni in the conductive intermediate layer (the conductive intermediate layer 5 according to the first embodiment, the conductive intermediate layer 50a according to the second embodiment) are ionized and are diffused into the conductive intermediate layer and the wiring circuit pattern 3, respectively. Consequently, an interface between the wiring circuit pattern and the conductive intermediate layer may corrode and an interface resistance may increase over time.

In the present embodiment, the first conductive intermediate layer 500a made of the sintered Cu ink film is interposed between the wiring circuit pattern 3 and the second conductive intermediate layer 500b made of the sintered Ni ink film. Thereby, even when the wiring circuit board 100 according to the present embodiment is used in a high-humidity environment, the increase in interface resistance over time can be maximally avoided. In order to restrict the interface resistance, the thickness of the first conductive intermediate layer 500a is desirably set at about 200 nm or more.

Further, in the present embodiment, the second conductive intermediate layer 500b and the third conductive intermediate layer 500c are formed to be stacked on the first conductive intermediate layer 500a. Thereby, as the effect of the second conductive intermediate layer 500b, the "solder leaching" of the first conductive intermediate layer 500a into the solder material 6 can be prevented when mounting the electronic part 7 on the wiring circuit board 100. Furthermore, as the effect of the third conductive intermediate layer 500c, the "solder wettability" with the solder material 6 can be enhanced similar to the second conductive intermediate layer 50b explained in the second embodiment. The third conductive intermediate layer 500c may be formed by use of the Ag ink instead of the Au ink. Also in this case, the "solder wettability" can be improved.

As stated above, the conductive intermediate layer 500 has a relatively complicated structure in which the three layers of sintered conductive ink films are stacked. However, since these conductive ink films are formed by use of the inkjet printing method capable of rapidly forming the conductive ink film only on desired areas (the electronic part mounting lands 31), the productivity is more excellent than a plating method or a conventional method using vacuum deposition. Moreover, according to the present embodiment, a large amount of drug solution is not required unlike a conventional plating method, there is obtained the effect that a load on the environment is so low.

The three embodiments according to the present invention have been described above. As stated above, in each embodiment of the present invention, the inkjet printing method much more excellent in the productivity than the conventional plating method or vacuum deposition method is used in the steps of forming the conductive intermediate layer having the function of preventing the "solder leaching" phenomenon. Thereby, the conductive ink film can be formed only on desired areas (such as the electronic part mounting lands 31) with a low environment load and with good productivity. Further, in each embodiment of the present invention, the discharged droplets of the conductive ink are stacked in an overlapped manner thereby to form a conductive ink film, and then the conductive ink film is sintered thereby to form a conductive intermediate layer. Thus, the high-quality conductive intermediate layer with no microscopic pore can be formed.

In the second embodiment and the third embodiment, the conductive intermediate layer is configured to have two or more kinds of sintered conductive ink films. Thus, the multiple functions of the conductive intermediate layer such as enhancement in the solder wettability or prevented increase in the interface resistance can be achieved. The thickness of each conductive intermediate layer is adjusted depending on a demanded performance or cost as needed.

The present invention is not limited to the first to third embodiments, and various modifications may be made without departing from the spirit of the present invention. Some specific examples will be described below.

Before the step of printing a conductive ink on the electronic part mounting land 31 of the wiring circuit pattern 3 by the inkjet printing method, the surface of the wiring circuit pattern 3 (the electronic part mounting land 31) may be subjected to a processing of removing the remaining resin components on the surface. The processing may include etching by carbon tetrafluoride gas, etching by solvent, carbon dioxide gas plasma processing, oxygen plasma processing and the like. Thereby, interlayer adhesion between the conductive intermediate layer 5, 5', 50, 500 and the electronic part mounting land 31 can be enhanced. Consequently, for example, when the electronic part 7 is bonded on the conductive intermediate layer 5, 5', 50, 500, if a stress occurs when the cream solder 6A applied on the conductive intermediate layer 5, 5', 50, 500 is melt and then solidified to be solder material 6, a possible interlayer release between the conductive intermediate layer 5, 5', 50, 500 and the electronic part mounting land 31 can be maximally avoided.

There has been described with reference to FIG. 3 that in the first embodiment, the surface peripheral part 31A of the electronic part mounting land 31 formed as part of the wiring circuit pattern 3 is coated with the cover coat 4 to be pressed, but the embodiments of the present invention are not limited thereto.

For example, when the electronic part 7 to be mounted on the wiring circuit board is as small as a chip part having 0603 size (0.6 mm×0.3 mm) or 0402 size (0.4 mm×0.2 mm), if the shape and size of the electronic part mounting land 31 are adapted to those of the external terminal electrode 71 of the chip part, a side of the electronic part mounting land 31 has a dimension of at least 0.3 mm or less. Thus, even when the surface peripheral part 31A of the electronic part mounting land 31 is attempted to be coated with the cover coat 4, the opening print is actually so difficult due to the printability of the cover coat paste used for forming the cover coat 4.

When the electronic part mounting land 31 is so small, the surface peripheral part 31A of the electronic part mounting land 31 may not be coated with the cover coat 4. For example, the entire electronic part mounting land 31 may be exposed at the bottom surfaces of the openings 41 of the cover coat 4. In this case, the conductive intermediate layer 5, 5', 50, 500 is desirably formed to fully coat the main surface (top surface) and sides of the electronic part mounting land 31. Thus, the "solder leaching" of the wiring circuit pattern 3 into the solder material 6 can be surely prevented.

The conductive intermediate layer 5, 5', 50, 500 may be formed before forming the cover coat 4. In other words, the conductive intermediate layer 5, 5', 50, 500 may be formed on the electronic part mounting land 31 before coating the insulative base material 2 and the wiring circuit pattern 3 with the cover coat 4, and then the cover coat 4 may be formed. Even in this case, the effects of the present invention can be obtained without increasing process time.

The hardening of the wiring circuit pattern 3 and the sintering of the conductive ink film may be performed in the same heating step. In other words, as described above, the wiring circuit pattern 3 is formed, for example, by printing the conductive paste on the insulative base material 2 according to a desired pattern by use of the screen printing method and then hardening the printed conductive paste. In this case, for forming the conductive ink film on the electronic part mounting land 31 of the wiring circuit pattern 3 by applying the conductive ink by the inkjet printing method, the following may be employed.

First, a conductive paste is applied on the insulative base material 2 according to a desired pattern by the screen printing method. Then, the pattern-formed conductive paste is pre-dried. Then, a conductive ink film is formed on the electronic part mounting land 31. Thereafter, a heating processing is performed at 260° C. or less to simultaneously perform the hardening of the pattern-formed conductive paste and the sintering of the conductive ink film. Thereby, the wiring circuit pattern 3 and the conductive intermediate layer 5, 5', 50, 500 are collectively formed. With this method, the pre-dried conductive paste serves as a conductive ink receiving layer so that the solvent components contained in the discharged droplets ID of the conductive ink arriving at the electronic part mounting land 31 are absorbed in the conductive paste. Thus, with the method, soaking and repelling of the conductive ink can be restricted and the adhesion between the electronic part mounting land 31 and the conductive intermediate layer 5, 5', 50, 500 can be enhanced.

When the Cu ink is used to form the conductive intermediate layer on the electronic part mounting land 31 like the conductive intermediate layer 5' according to the variant of the first embodiment or the conductive intermediate layer 500a according to the third embodiment, a reducing agent having a reduction action against oxidization of the Cu powder contained in the Cu ink may be added to the conductive paste for forming the wiring circuit pattern 3. Thereby, when sintering the Cu ink film, Cu in the Cu ink film is reduced by the reducing agent contained in the conductive paste without the sintering in a reduction atmosphere such as hydrogen gas. With the method, since a hydrogen gas is not used, safety of the steps can be enhanced and the sintering equipment can be simplified.

The inkjet printing method is used to apply the conductive ink on the electronic part mounting land 31 in the above embodiments, but the present invention is not limited thereto and may employ other droplet discharging method. For example, when the area of the electronic part mounting land 31 is large, the conductive ink film can be more efficiently formed by use of a dispenser method.

The modes of the present invention are not limited to the individual embodiments described above. The constituents in different embodiments may be appropriately combined. Various additions, modifications and partial deletions can be made without departing from the conceptual thought and spirit of the present invention derived from the contents and their equivalents defined in claims.

DESCRIPTION OF REFERENCE NUMERALS 1, 1', 10, 100: Wiring circuit board
2: Insulative base material
3: Wiring circuit pattern
4: Cover coat
5, 5', 50, 500: Conductive intermediate layer
6: Solder material
6A: Cream solder
7: Electronic part
8: Flexible cable
21: Insulative base material extension
31: Electronic part mounting land
31A: Surface peripheral part
31B: Surface center part
41: Opening
50a: First conductive intermediate layer
50b: Second conductive intermediate layer
71: External terminal electrode
500a: First conductive intermediate layer
500b: Second conductive intermediate layer
500c: Third conductive intermediate layer
ID: Discharged droplet of conductive ink

The invention claimed is:

1. A wiring circuit board comprising:
an insulative base material;
a wiring circuit pattern formed on at least one surface of the insulative base material;
an electronic part mounting land which is formed as part of the wiring circuit pattern and to which an electronic part is bonded by a solder material; and
a conductive intermediate layer formed on the electronic part mounting land, wherein
the wiring circuit pattern is made of a hardened conductive paste, and the conductive intermediate layer is made of a conductive ink film which contains at least nickel (Ni) and is sintered at 260° C. or less,
the conductive intermediate layer is made of two or more sintered conductive ink films stacked, and a thickness of an uppermost layer is smaller than that of a lowermost layer in the sintered conductive ink films stacked.

2. The wiring circuit board according to claim 1, wherein the conductive ink film is made of a plurality of discharged droplets of a conductive ink partially overlapped on each other.

3. The wiring circuit board according to claim 2, wherein the conductive intermediate layer is made of the sintered conductive ink film containing Cu or Ag—Pd alloy as a conductive material.

4. The wiring circuit board according to claim 1, wherein the conductive intermediate layer is made of the sintered conductive ink film containing Cu or Ag—Pd alloy as a conductive material.

5. The wiring circuit board according to claim 1, wherein each of the conductive ink films is made of a plurality of discharged droplets of a conductive ink partially overlapped on each other.

6. The wiring circuit board according to claim 1, wherein the uppermost layer in the conductive intermediate layer is made of the sintered conductive ink film containing Au or Ag as a conductive material.

7. The wiring circuit board according to claim 1, wherein the wiring circuit pattern contains Ag, and
the lowermost layer in the conductive intermediate layer is made of the sintered conductive ink film containing Cu as a conductive material.

* * * * *